(12) United States Patent
Weng

(10) Patent No.: US 12,176,880 B2
(45) Date of Patent: Dec. 24, 2024

(54) BULK ACOUSTIC WAVE RESONATOR AND FABRICATION METHOD THEREOF

(71) Applicant: Shenzhen Newsonic Technologies Co., Ltd., Shenzhen (CN)

(72) Inventor: Guojun Weng, Shenzhen (CN)

(73) Assignee: Shenzhen Newsonic Technologies Co., Ltd., Shenzhen (CN)

( * ) Notice: Subject to any disclaimer, the term of this patent is extended or adjusted under 35 U.S.C. 154(b) by 0 days.

(21) Appl. No.: 18/324,679

(22) Filed: May 26, 2023

(65) Prior Publication Data

US 2023/0299737 A1    Sep. 21, 2023

Related U.S. Application Data

(63) Continuation of application No. 18/056,808, filed on Nov. 18, 2022, now Pat. No. 11,699,987.

(51) Int. Cl.
*H03H 9/17* (2006.01)
*H03H 9/02* (2006.01)
*H03H 9/13* (2006.01)

(52) U.S. Cl.
CPC ........ *H03H 9/173* (2013.01); *H03H 9/02031* (2013.01); *H03H 9/13* (2013.01)

(58) Field of Classification Search
CPC ....... H03H 9/173; H03H 9/02031; H03H 9/13
See application file for complete search history.

(56) References Cited

U.S. PATENT DOCUMENTS

| | | |
|---|---|---|
| 2004/0257171 A1 | 12/2004 | Park et al. |
| 2007/0152540 A1 | 7/2007 | Fujii et al. |
| 2010/0112233 A1 | 5/2010 | Iwamoto et al. |
| 2017/0264263 A1 | 9/2017 | Huang et al. |
| 2017/0310299 A1 | 10/2017 | Bower et al. |
| 2019/0288658 A1* | 9/2019 | Kim ................. H03H 9/0523 |
| 2019/0288667 A1 | 9/2019 | Hayashi et al. |
| 2019/0379344 A1* | 12/2019 | Wang .............. H03H 9/1021 |
| 2021/0006229 A1 | 1/2021 | Yantchev |
| 2021/0226600 A1* | 7/2021 | Yang ................. H10N 30/708 |
| 2021/0345492 A1 | 11/2021 | Park et al. |
| 2022/0103147 A1* | 3/2022 | Wang .............. H03H 9/02574 |
| 2022/0166398 A1* | 5/2022 | Bousquet ......... H01L 21/7806 |
| 2022/0352456 A1 | 11/2022 | Moe et al. |

* cited by examiner

*Primary Examiner* — Bryan P Gordon
(74) *Attorney, Agent, or Firm* — Finnegan, Henderson, Farabow, Garrett & Dunner, LLP.

(57) ABSTRACT

A bulk acoustic wave (BAW) resonator includes a substrate, a piezoelectric layer disposed above the substrate, a first electrode disposed below the piezoelectric layer, a second electrode disposed above the piezoelectric layer, a first dielectric layer, a second dielectric layer, and a third dielectric layer disposed between the substrate and the piezoelectric layer, and a bonding layer disposed between the third dielectric layer and the substrate. The first dielectric layer is disposed below the piezoelectric layer and includes a cavity. The third dielectric layer is disposed below the first dielectric layer and includes a protruding structure protruding towards the piezoelectric layer. The second dielectric layer overlays the third dielectric layer including the protruding structure, the second dielectric layer and the protruding structure of the third dielectric layer constituting a double-wall boundary structure surrounding the cavity.

13 Claims, 20 Drawing Sheets

BULK ACOUSTIC WAVE RESONATOR AND FABRICATION METHOD THEREOF

CROSS-REFERENCE TO RELATED APPLICATION

This application is a continuation of application Ser. No. 18/056,808, filed Nov. 18, 2022, the contents of which are incorporated herein by reference in their entirety.

FIELD OF THE DISCLOSURE

The present disclosure relates to the field of semiconductor devices and, in particular, to a bulk acoustic wave (BAW) resonator and a fabrication method of the BAW resonator.

BACKGROUND

A bulk acoustic wave (BAW) resonator is a device including a thin film that is made of a piezoelectric material and disposed between two electrodes. The BAW resonator device is typically fabricated using semiconductor microprocessing technology.

A BAW filter may include two or more BAW resonators. It is desirable to fabricate BAW filters and/or BAW resonators with superior quality and performance. As the quality and performance of the BAW resonators depend on the quality of the piezoelectric thin films included in the BAW resonators, there is a need to improve the quality of the piezoelectric material for forming the piezoelectric thin films.

SUMMARY

According to one aspect of the disclosure, a bulk acoustic wave (BAW) resonator includes a substrate, a piezoelectric layer disposed above the substrate, a first electrode disposed below the piezoelectric layer, a second electrode disposed above the piezoelectric layer, a first dielectric layer, a second dielectric layer, and a third dielectric layer disposed between the substrate and the piezoelectric layer, and a bonding layer disposed between the third dielectric layer and the substrate. The first dielectric layer is disposed below the piezoelectric layer and includes a cavity. The third dielectric layer is disposed below the first dielectric layer and includes a protruding structure protruding towards the piezoelectric layer. The second dielectric layer overlays the third dielectric layer including the protruding structure, the second dielectric layer and the protruding structure of the third dielectric layer constituting a double-wall boundary structure surrounding the cavity.

According to another aspect of the disclosure, a fabrication method of a bulk acoustic wave (BAW) resonator, includes: obtaining a temporary substrate; forming a buffer layer on the temporary substrate; forming a piezoelectric layer on the buffer layer; forming a first electrode on the piezoelectric layer; forming a first dielectric layer on the piezoelectric layer and covering the first electrode; forming a trench in the first dielectric layer, the trench surrounding a portion of the first dielectric layer; forming a second dielectric layer on the first dielectric layer and in the trench in the first dielectric layer; forming a third dielectric layer on the second dielectric layer, the third dielectric layer filling in the trench in the first dielectric layer; forming a bonding layer on the third dielectric layer; bonding a resonator substrate to the third dielectric layer via the bonding layer; removing the temporary substrate and the buffer layer to expose a surface layer of the piezoelectric layer; removing the surface layer of the piezoelectric layer to obtain a thinned piezoelectric layer; forming a second electrode on the thinned piezoelectric layer; and removing the portion of the first dielectric layer surrounded by the trench to form a cavity.

BRIEF DESCRIPTION OF THE DRAWINGS

The accompanying drawings, which are incorporated in and constitute a part of this application, illustrate disclosed embodiments and, together with the description, serve to explain the disclosed embodiments.

DETAILED DESCRIPTION

Figure 1A:
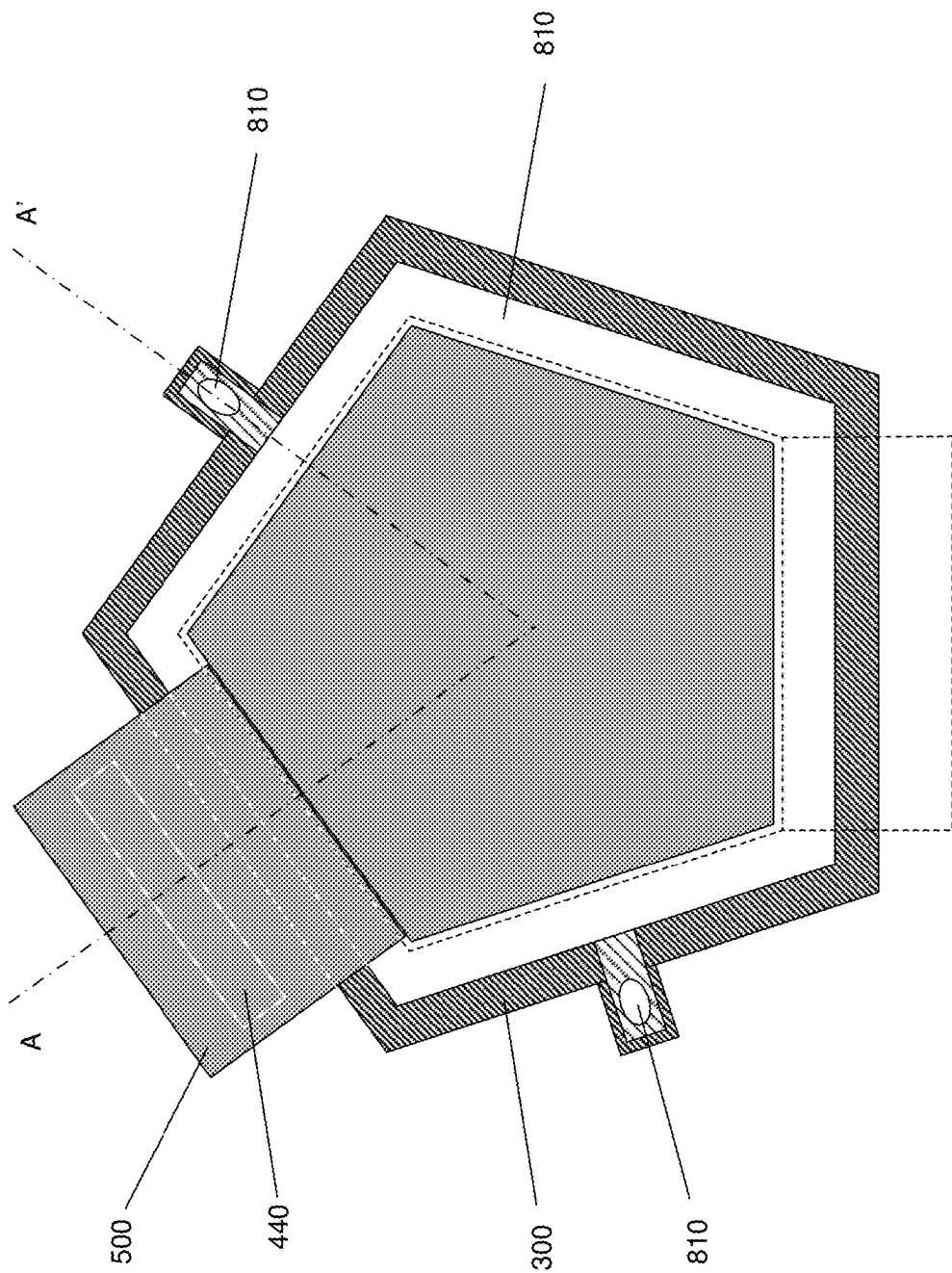
FIG. 1A is a top view showing selected portions of a BAW resonator to be used in a BAW filter, according to an embodiment of the present disclosure.

The text below provides a detailed description of the present disclosure in conjunction with specific embodiments illustrated in the attached drawings. However, these embodiments do not limit the present disclosure. The scope of protection for the present disclosure covers changes made to the structure, method, or function by persons having ordinary skill in the art on the basis of these embodiments.

To facilitate the presentation of the drawings in the present disclosure, the sizes of certain structures or portions may be enlarged relative to other structures or portions. Therefore, the drawings in the present disclosure are only for the purpose of illustrating the basic structure of the subject matter of the present disclosure. The same numbers in different drawings represent the same or similar elements unless otherwise represented.

Additionally, terms in the text indicating relative spatial position, such as "top," "bottom," "upper," "lower," "above," "below," and so forth, are used for explanatory purposes in describing the relationship between a unit or feature depicted in a drawing and another unit or feature therein. Terms indicating relative spatial position may refer to positions other than those depicted in the drawings when a device is being used or operated. For example, if a device shown in a drawing is flipped over, a unit which is described as being positioned "below" or "under" another unit or feature will be located "above" the other unit or feature. Therefore, the illustrative term "below" may include positions both above and below. A device may be oriented in other ways (e.g., rotated 90 degrees or facing another direction), and descriptive terms that appear in the text and are related to space should be interpreted accordingly. When a component or layer is said to be "above" another member or layer or "connected to" another member or layer, it may be directly above the other member or layer or directly connected to the other member or layer, or there may be an intermediate component or layer.

In a fabrication process of a bulk acoustic wave (BAW) resonator, a silicon oxide layer (which may be referred to as "buffer layer") is first formed on a substrate, an aluminum nitride (AlN) seed layer is deposited on the silicon oxide layer, and then a lower electrode, a piezoelectric layer, and an upper electrode are sequentially deposited on the AlN seed layer. Thus, the piezoelectric layer is formed by deposition on an electrode layer. Due to the lattice matching between the piezoelectric layer and the electrode layer, the crystal quality of the initially deposited piezoelectric layer is relatively poor, and the piezoelectric performance of the piezoelectric layer is also relatively poor.

Embodiments of the present disclosure provide a fabrication method of a BAW resonator in which a temporary substrate is obtained, a buffer layer is deposited on the temporary substrate, and a piezoelectric layer is deposited on the buffer layer. Then, a first electrode is formed on the piezoelectric layer, and first, second and third dielectric layers are sequentially formed. The first, second and third dielectric layers are used for forming a cavity boundary structure and a cavity sacrificial layer, and for bonding a substrate of the BAW resonator. Next, an amorphous silicon bonding layer is formed to bond the substrate. Afterwards, the temporary substrate, the buffer layer, and a surface layer of the piezoelectric layer are removed. Then, a second electrode is formed on the piezoelectric layer, and a cavity is formed by removing the sacrificial layer.

The above-described fabrication method uses bonding and double-sided processing technique, which provides flexibility in selecting the time when the electrodes and the piezoelectric layer are deposited, and in selecting the substrate material on to which the piezoelectric layer is deposited. Thus, a suitable substrate material can be selected in order to obtain a high-quality piezoelectric layer. In addition, due to the special characteristics of the double-sided processing technique, the initially deposited part of the piezoelectric layer, the crystal quality of which is relatively poor, can be removed after the substrate is bonded and the temporary substrate is removed, which exposes the initial deposited part of the piezoelectric layer. As a result, the quality of the piezoelectric layer of the BAW resonator is improved, and thus the performance of the BAW resonator and a filter including the BAW resonator can be improved.

Figure 1B:
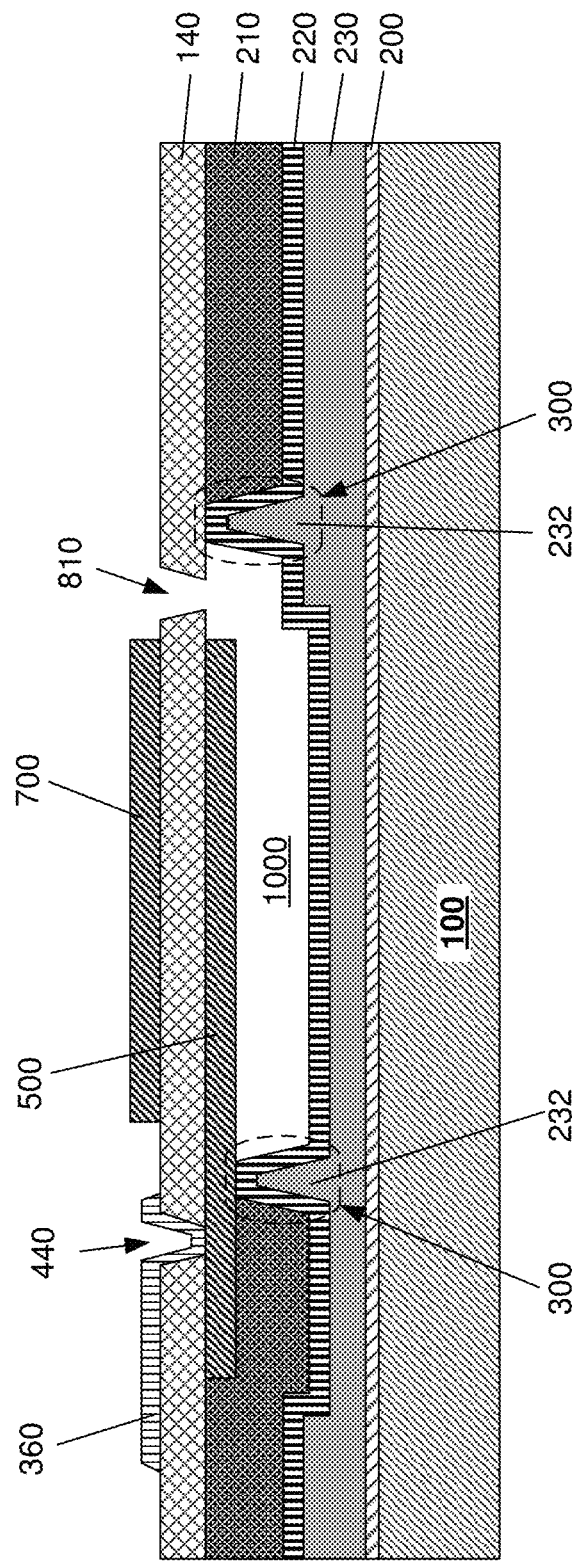
FIG. 1B is a cross-sectional view of the BAW resonator of FIG. 1A, along cross-sectional line A-A' shown in FIG. 1A.

FIG. 1A is a top view showing selected portions of a BAW resonator 10 to be used in a BAW filter, according to an embodiment of the present disclosure. FIG. 1B is a cross-sectional view of the BAW resonator 10 of FIG. 1A, along cross-sectional line A-A' shown in FIG. 1A.

As illustrated in FIGS. 1A and 1B, BAW resonator 10 includes a resonator substrate 100, a piezoelectric layer 140 disposed above resonator substrate 100, a first electrode 500 disposed below piezoelectric layer 140, a second electrode 700 disposed above piezoelectric layer 140, a first dielectric layer 210, a second dielectric layer 220, and a third dielectric layer 230 disposed between resonator substrate 100 and piezoelectric layer 140, and a bonding layer 200 disposed between third dielectric layer 230 and resonator substrate 100. First dielectric layer 210 is disposed below piezoelectric layer 140 and includes a cavity 1000. Third dielectric layer 230 is disposed below first dielectric layer 210 and includes a protruding structure 232 protruding from bonding layer 200 towards piezoelectric layer 140. Second dielectric layer 220 overlays third dielectric layer 230 including protruding structure 232. Second dielectric layer 220 and protruding structure 232 of third dielectric layer 230 together constitute a double-wall boundary structure 300 surrounding cavity 1000.

First dielectric layer 210 may be formed of silicon oxide. First dielectric layer 210 covers a portion of a lower surface of first electrode 500 and a portion of a lower surface of piezoelectric layer 140. The portions of first electrode 500 and piezoelectric layer 140 not covered by first dielectric layer 210 correspond to cavity 1000 of BAW resonator 10, which is formed by removing a portion of first dielectric layer 210 (referred to as a "sacrificial island") enclosed by second dielectric layer 220.

Second dielectric layer 220 may be formed of a non-conductive material that cannot be etched by hydrofluoric acid, such as, for example, polysilicon, amorphous silicon, silicon nitride, aluminum nitride, gallium nitride, tantalum nitride, or a stacked combination of two or more of those materials. Second dielectric layer 220 is disposed between third dielectric layer 230 and first dielectric layer 210, and encloses cavity 1000. A portion of second dielectric layer 220 at the sidewall of cavity 1000 constitutes a part of double-wall boundary structure 300, which defines cavity 1000. The top of the portion of second dielectric layer 220 that constitutes the part of double-wall boundary structure 300 is in contact with a portion of piezoelectric layer 140 and a portion first electrode 500. Double-wall boundary structure 300 surrounds a working area of BAW resonator 10 in which first electrode 500 and second electrode 700 are partially overlapped.

Third dielectric layer 230 is disposed on a surface of second dielectric layer 220 away from the side facing piezoelectric layer 140. Third dielectric layer 230 fills between the double side walls of double-wall boundary structure 300. The surface of third dielectric layer 230 away from second dielectric layer 220 is planarized to serve as a bonding surface for bonding to resonator substrate 100 via bonding layer 200. Third dielectric layer 230 may be formed of silicon oxide, silicon nitride, aluminum nitride, or a stacked combination of two or more of those.

Bonding layer 200 may be formed of amorphous silicon, and may have a thickness ranging from approximately 3 nm to approximately 50 nm. The amorphous silicon bonding layer 200 is located between resonator substrate 100 and third dielectric layer 230. The amorphous silicon bonding layer 200 is deposited on the planarized surface of third dielectric layer 230 and is bonded to resonator substrate 100. When a surface layer of third dielectric layer 230 is formed of silicon oxide and resonator substrate 100 is formed of single crystal silicon, the amorphous silicon bonding layer eliminates unexpected conductive channels formed at the silicon oxide-single crystal silicon interface, and improves the quality factor Q of the resonator and the filter performance.

In some embodiments, resonator substrate 100 may be formed of silicon. In other words, resonator substrate 100 may be a silicon wafer. In some other embodiments, resonator substrate 100 may include a surface layer facing bonding layer 200 and formed of silicon, and a body formed of silicon oxide, sapphire ($Al_2O_3$), gallium nitride, silicon carbide, aluminum nitride, silicon nitride, or a stacked combination of two or more of those materials.

Piezoelectric layer 140 may be formed of AlN or ScAlN. Piezoelectric layer 140 includes one or more release holes 810 that expose cavity 1000, and a contact hole 440 that exposes a portion of first electrode 500. A pad metal layer 360 disposed on piezoelectric layer 140 and in contact hole 440, and electrically connected to first electrode 500 via contact hole 440.

Figure 2:
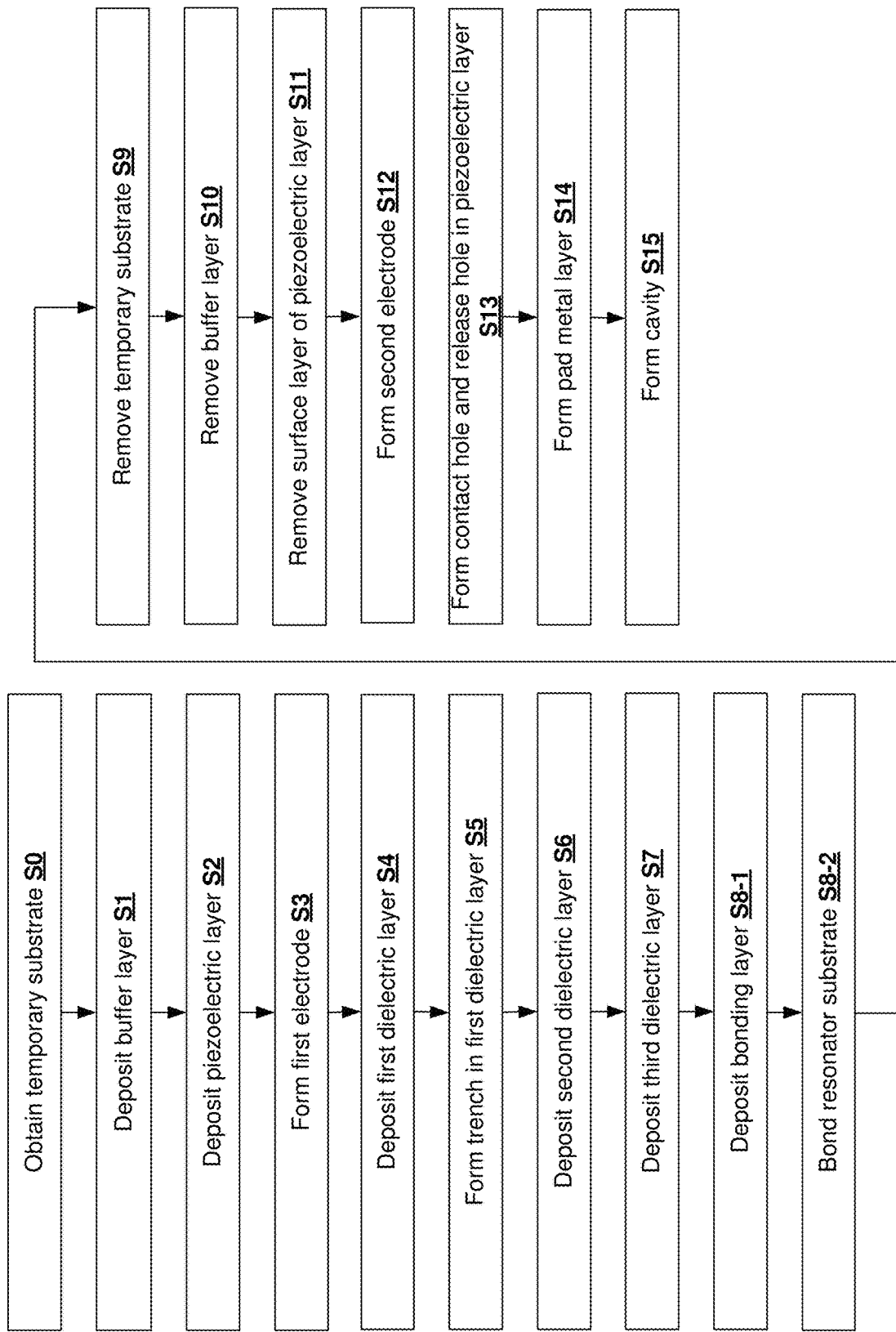
FIG. 2 is a flow chart of a process of fabricating the BAW resonator of FIGS. 1A and 1B, according to an embodiment of the present disclosure.
Figure 3A:
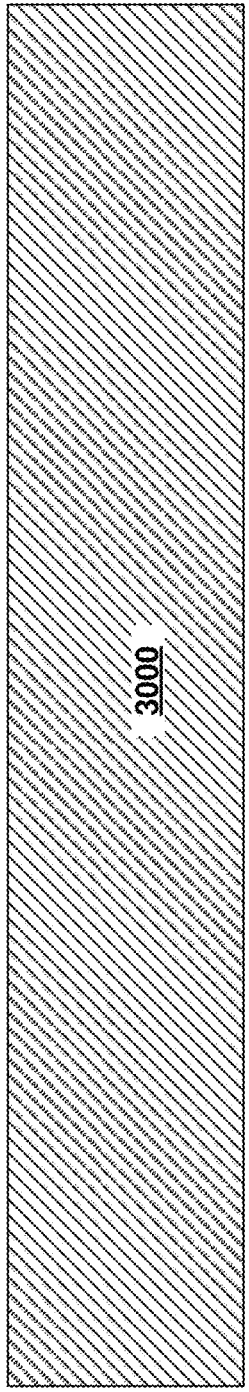
FIGS. 3A-3Q are cross-sectional views of structures formed in the process of FIG. 2, according to an embodiment of the present disclosure.

FIG. 2 is a flow chart of a process of fabricating BAW resonator 10, according to an embodiment of the present disclosure. FIGS. 3A-3Q are cross-sectional views of structures formed in the process of FIG. 2, according to an embodiment of the present disclosure.

As illustrated in FIG. 3A, in step S0, a temporary substrate 3000 is obtained. Temporary substrate 3000 may be formed of silicon.

Figure 3B:
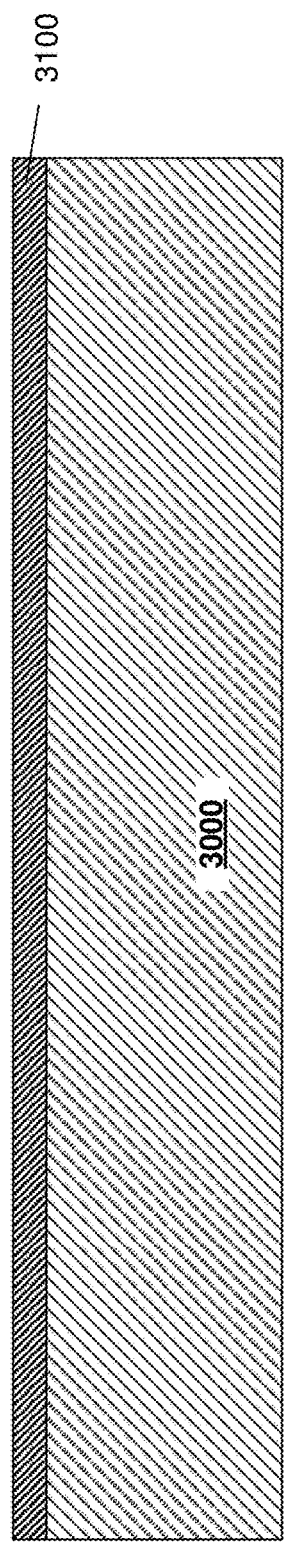

As illustrated in FIG. 3B, in step S1, a buffer layer 3100 is deposited on temporary substrate 3000. Buffer layer 3100 serves as an etch stop layer for removing temporary substrate 3000 in a subsequent process. Buffer layer 3100 also serves as a transition layer, which is beneficial to the quality of piezoelectric layer 140 which is subsequently grown on buffer layer 3100. Buffer layer 3100 may be formed of silicon oxide ($SiO_2$), silicon nitride (SiN), aluminum oxide ($Al_2O_3$), gallium nitride (GaN), aluminum nitride (AlN), or silicon carbide (SiC), or a stacked combination of two or more of those materials.

In one embodiment, an AlN layer is deposited on temporary substrate 3000 which is formed of silicon, and a GaN layer is deposited on the AlN layer. The stack of AlN layer and GaN layer is used as buffer layer 3100. In a subsequent process, an AlN or ScAlN piezoelectric layer is deposited on the surface of the GaN layer. Due to the good lattice matching between GaN and AlN/ScAlN, the crystal quality of the AlN or ScAlN piezoelectric layer is good.

In another embodiment, a silicon oxide layer is formed on the silicon temporary substrate 3000. The silicon oxide layer severs as buffer layer 3100, which also serves as an etch stop layer for subsequent removal of temporary substrate 3000. Then, a thin AlN seed layer ("first AlN layer") is deposited on the silicon oxide buffer layer 3100. The thin AlN seed layer is used to bond resonator substrate 100 in a subsequent process, and may be removed after removal of temporary substrate 3000. Therefore, the AlN seed layer may be formed thicker, which is beneficial to the quality of the piezoelectric crystal deposited thereon. Afterwards, an AlN layer ("second AlN layer") or a ScAlN piezoelectric layer is deposited on the AlN seed layer. The AlN seed layer may be removed after resonator substrate 100 is bonded and temporary substrate 3000 is removed.

In another embodiment, an AlN thin layer ("a first AlN layer") is directly deposited on the silicon temporary substrate 3000 to serve as buffer layer 3100. The lattice quality of the AlN thin layer directly deposited on silicon temporary substrate 3000 is better than that of an AlN thin layer deposited on a silicon oxide layer. In addition, because the AlN thin layer may be removed in a subsequent process, the AlN thin layer may be formed thicker. After depositing the AlN thin layer, an AlN layer ("a second AlN layer") or a ScAlN piezoelectric layer is deposited on the AlN thin layer. The AlN thin layer may be removed after resonator substrate 100 is bonded and temporary substrate 3000 is removed.

In another embodiment, when the piezoelectric layer is formed of pure AlN that is not doped with Sc, a silicon oxide layer may be deposited on temporary substrate 3000 to serve as buffer layer 3100. An AlN piezoelectric layer may be directly and continuously deposited on the silicon oxide layer at one time. After resonator substrate 100 is bonded and temporary substrate 3000 are removed, a lower portion of the AlN piezoelectric layer (the initially deposited part) may be removed to leave the remaining portion (an upper portion) of the AlN piezoelectric layer with good crystal quality as piezoelectric layer 140.

In still another embodiment, when the piezoelectric layer is formed of pure AlN that is not doped with Sc, an AlN piezoelectric layer can be directly and continuously deposited on temporary substrate 3000. The initially deposited part of the AlN piezoelectric layer serves as buffer layer 3100, which may be removed after resonator substrate 100 is bonded and temporary substrate 3000 is removed. The later deposited part of the AlN piezoelectric layer with good crystal quality serves as piezoelectric layer 140.

Figure 3C:
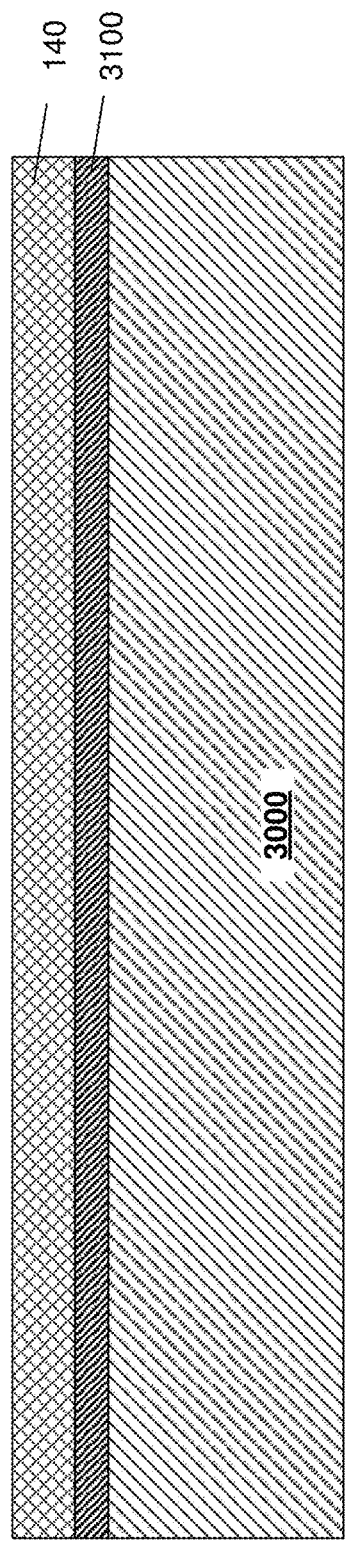

As illustrated in FIG. 3C, in step S2, piezoelectric layer 140 is deposited on buffer layer 3100. Piezoelectric layer 140 may be formed of AlN or scandium-doped aluminum nitride (ScAlN). The deposition thickness of piezoelectric layer 140 is greater than a target thickness of piezoelectric layer 140 in BAW resonator 10.

Figure 3D:
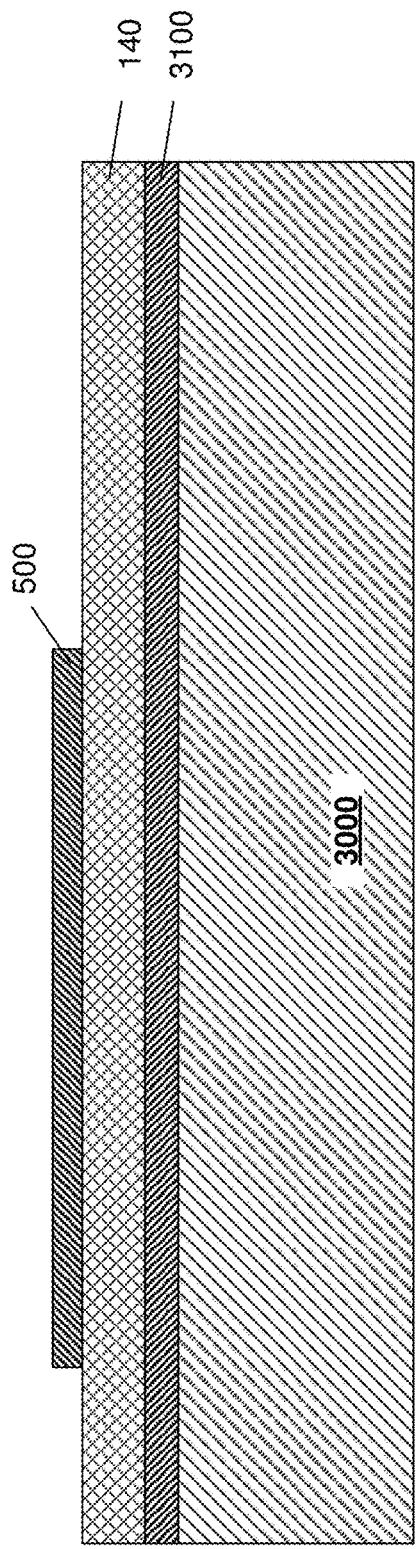

As illustrated in FIG. 3D, in step S3, first electrode 500 is formed on piezoelectric layer 140. First electrode 500 may be formed of a metal material.

Figure 3E:
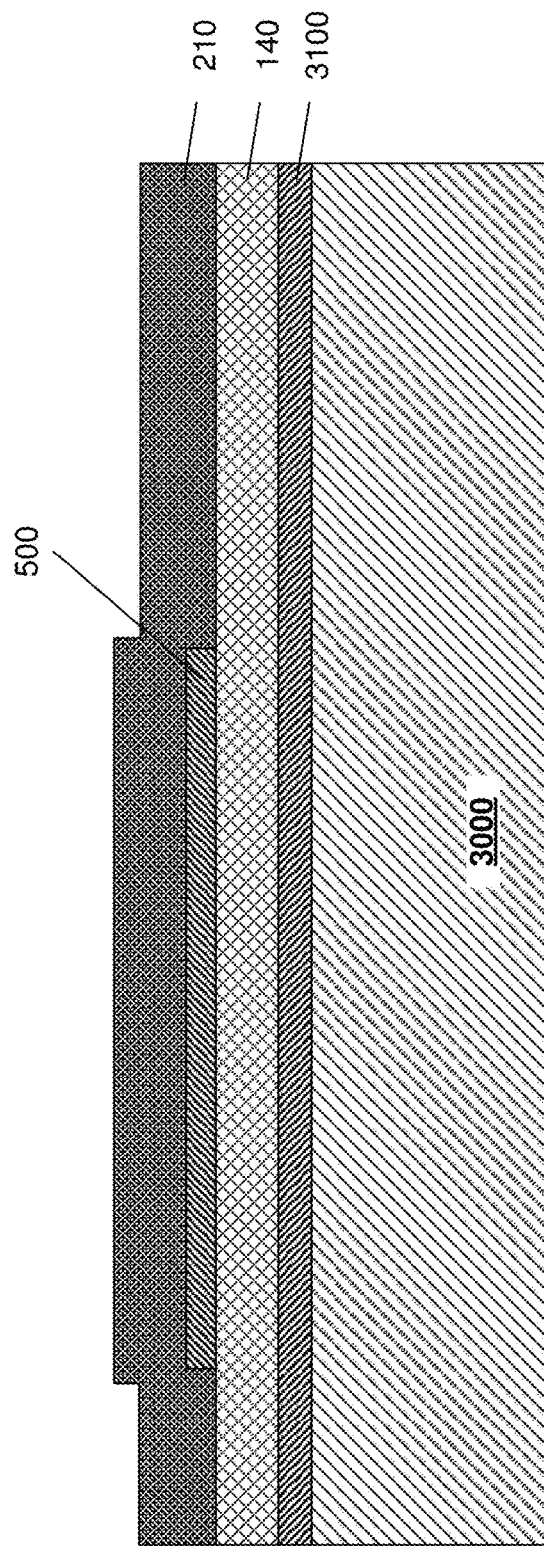

As illustrated in FIG. 3E, in step S4, first dielectric layer 210 is deposited on the structure of FIG. 3D. The deposited first dielectric layer 210 covers first electrode 500 and piezoelectric layer 140. First dielectric layer 210 may be formed of silicon oxide.

Figure 3F:
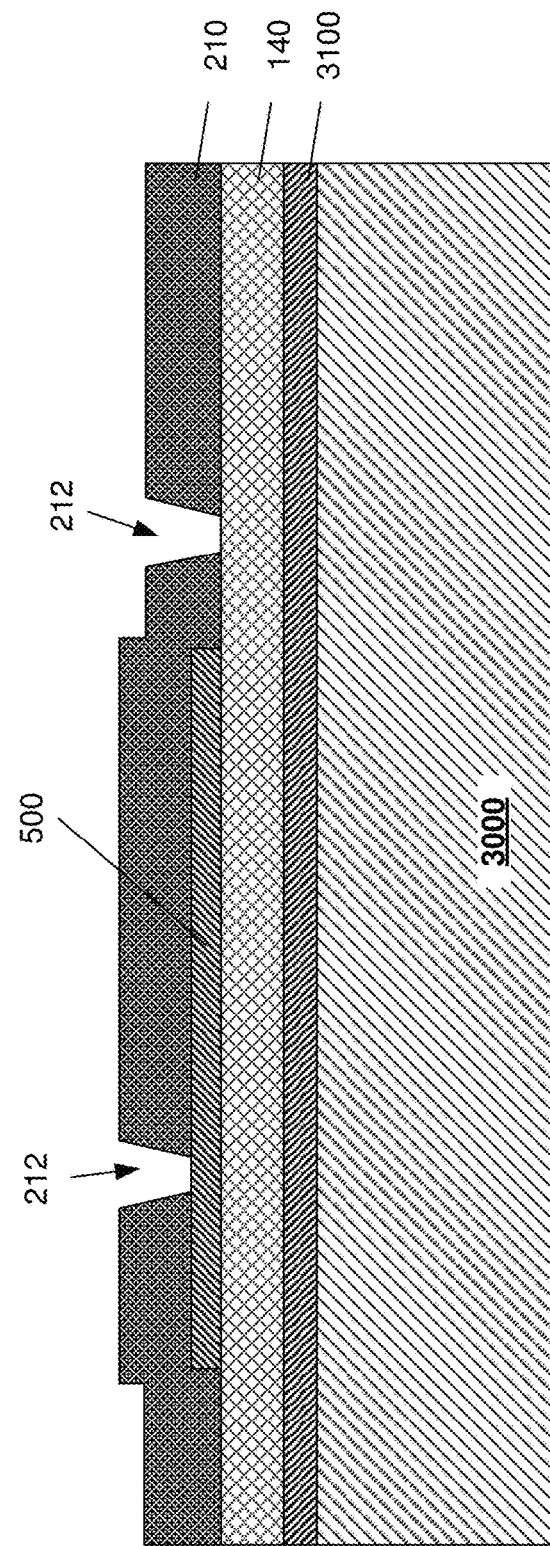

As illustrated in FIG. 3F, in step S5, first dielectric layer 210 is etched to form a trench 212 surrounding a working area of BAW resonator 10. The portion of first dielectric layer 210 surrounded by trench 212 serves as a sacrificial layer that will be removed in a subsequent process to form cavity 1000. A portion of piezoelectric layer 140 and a portion of first electrode layer 500 are exposed at the bottom of trench 212.

Figure 3G:
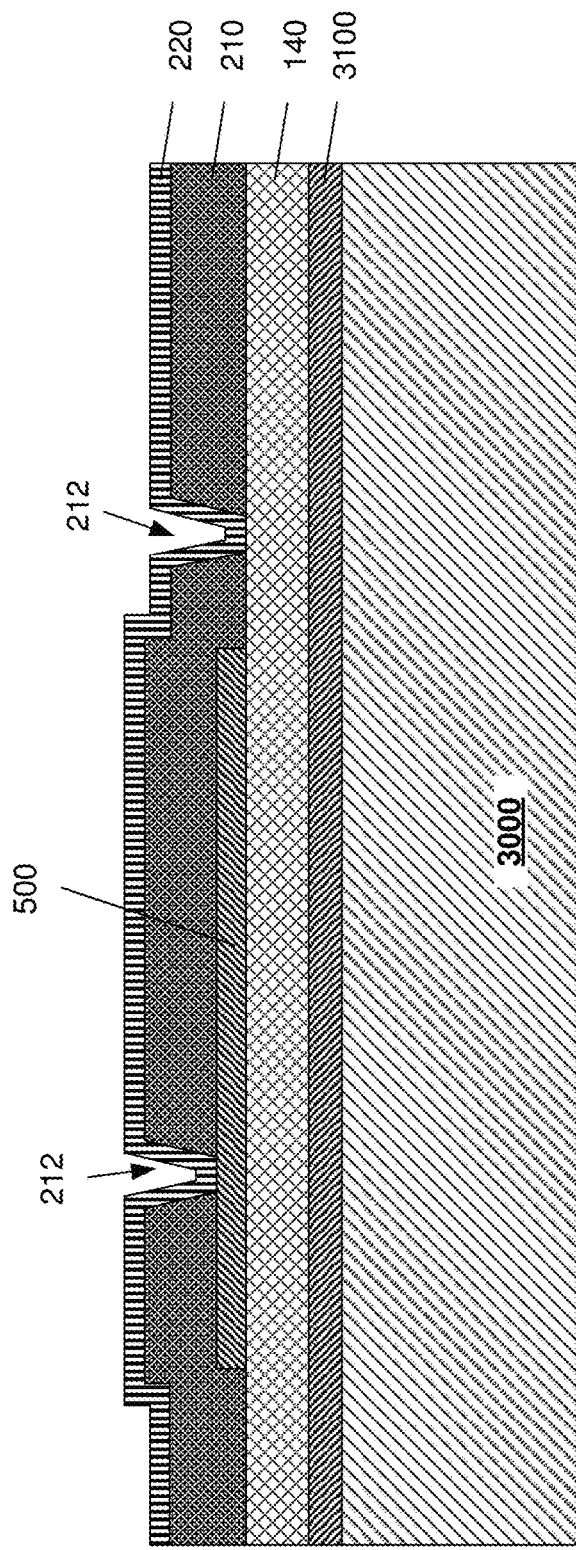

As illustrated in FIG. 3G, in step S6, second dielectric layer 220 is deposited on the surface of the structure of FIG. 3F. Second dielectric layer 220 completely covers the top surface of first dielectric layer 210, as well as the side surfaces of trench 212 formed in first dielectric layer 210. Second dielectric layer 220 also covers the portions of piezoelectric layer 140 and first electrode layer 500 exposed at the bottom of trench 212. Second dielectric layer 220 may be formed of polysilicon, amorphous silicon, silicon nitride, aluminum nitride, gallium nitride, tantalum nitride, or a stacked combination of two or more of those materials. The portion of second dielectric layer 220 deposited on the side surfaces of trench 212 constitutes part of double-wall boundary structure 300 that surrounds the working area of BAW resonator 10 and defines cavity 1000.

Figure 3H:
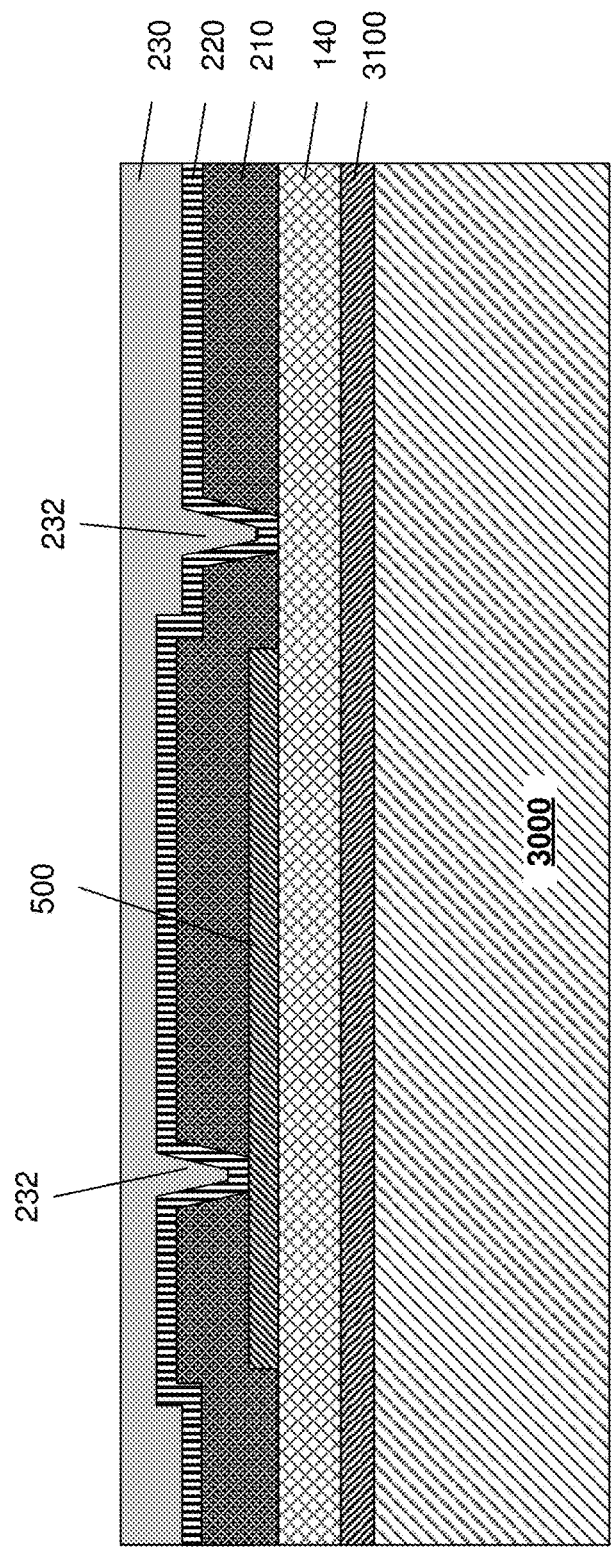

As illustrated in FIG. 3H, in step S7, third dielectric layer 230 is deposited on the surface of the structure of FIG. 3G. Then, the top surface of third dielectric layer 230 is planarized by using, for example, a chemical mechanical polishing (CMP) process. Third dielectric layer 230 fills in trench 212, forming protruding structure 232 which protrudes towards piezoelectric layer 140. Protruding structure 232 constitutes part of double-wall boundary structure 300. Third dielectric layer 230 may be formed of silicon oxide, silicon nitride, aluminum nitride, or other materials, or a stacked combination of two or more of those materials.

Figure 3I:
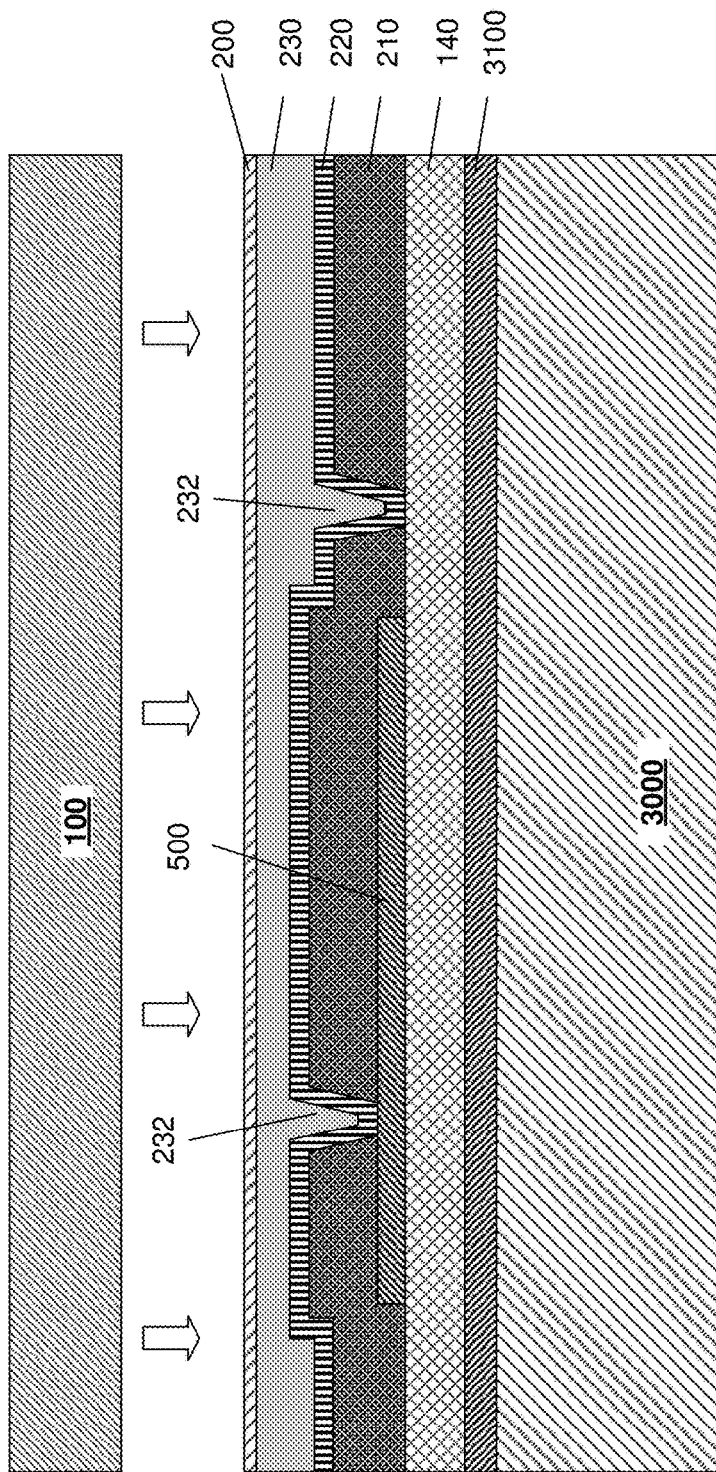

As illustrated in FIG. 3I, in step S8-1, a sputter target is sputtered in a vacuum environment (e.g., a vacuum chamber) to deposit bonding layer 200 on the planarized surface of third dielectric layer 230. The sputtering process may include physical vapor deposition (PVD) or electron beam irradiation. In some embodiments, resonator substrate 100 may be used as the sputtering target. In some other embodiments, another silicon wafer may be used as the sputtering target. Bonding layer 200 may be formed of amorphous silicon (amorphous-Si), and may have a thickness ranging from approximately 3 nm to approximately 50 nm.

Figure 3J:
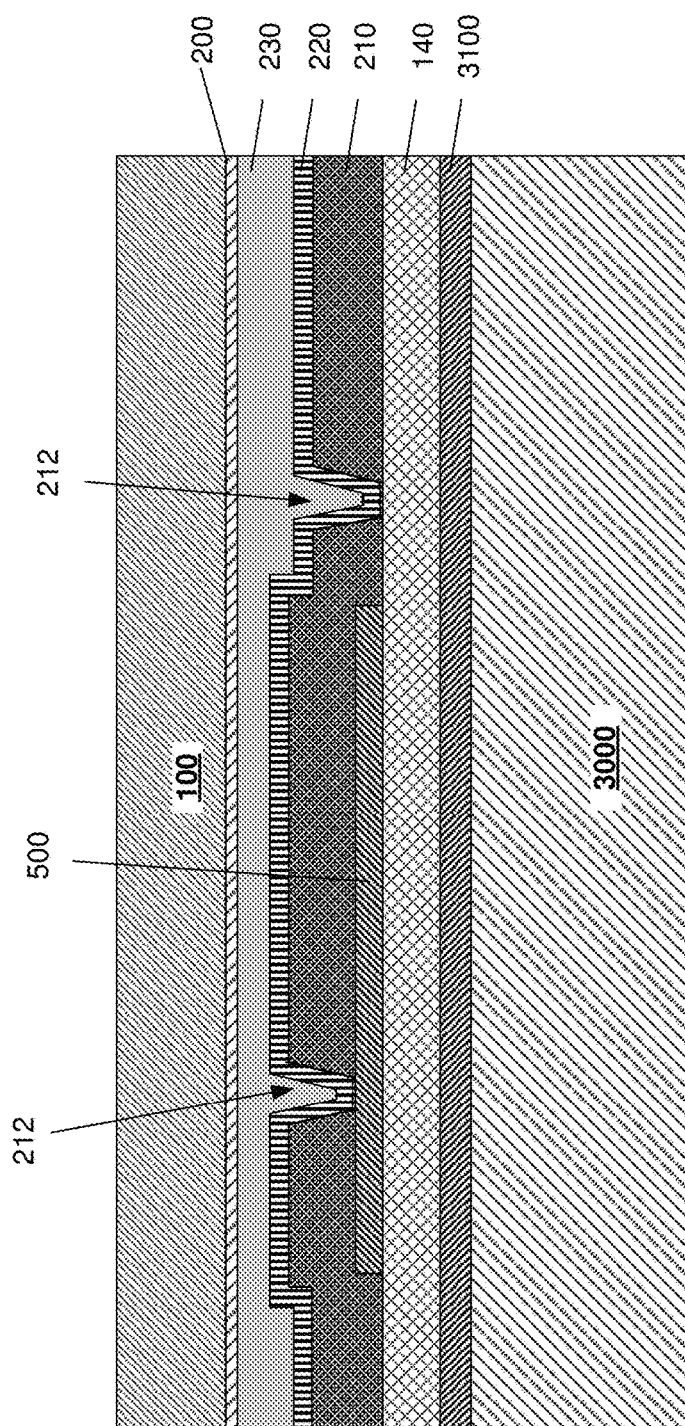

As illustrated in FIG. 3J, in step S8-2, after depositing bonding layer 200 and without exposing bonding layer 200 to air, resonator substrate 100 is bonded to third dielectric layer 230 via bonding layer 200 in the vacuum environment. In some embodiments, resonator substrate 100 may be formed of silicon. In other words, resonator substrate 100 may be a silicon wafer. In some other embodiments, resonator substrate 100 may include a surface layer facing third dielectric layer 230 and formed of silicon, and a body formed of silicon oxide, sapphire ($Al_2O_3$), gallium nitride, silicon carbide, aluminum nitride, silicon nitride, or a stacked combination of two or more of those materials.

Figure 3K:
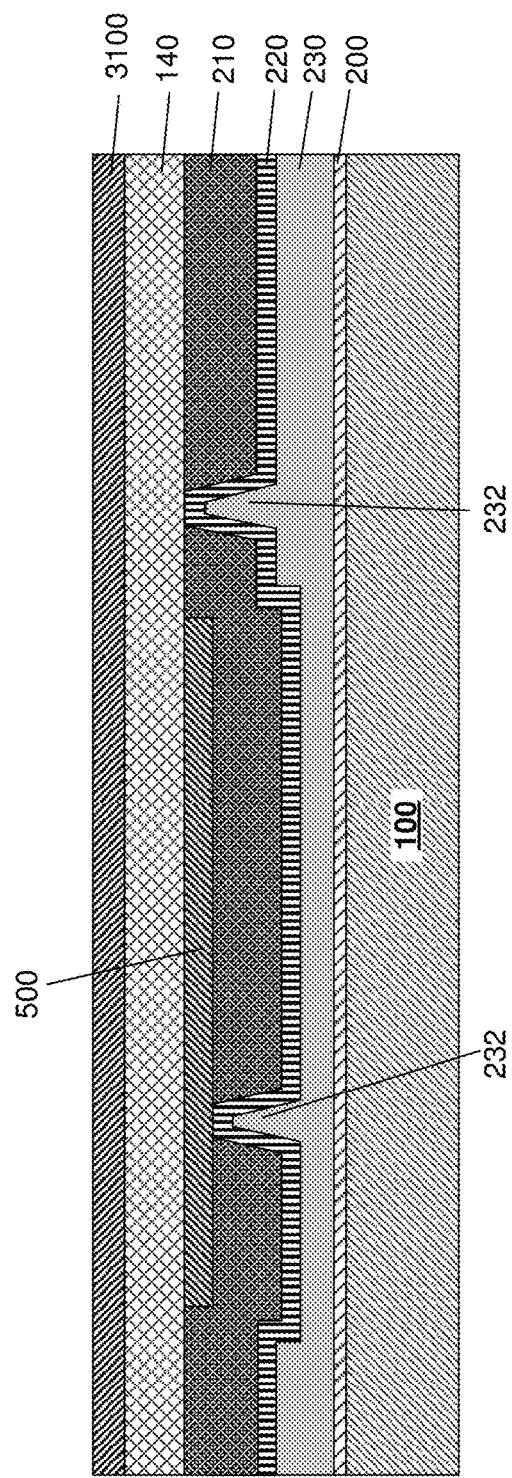

As illustrated in FIG. 3K, in step S9, the structure of FIG. 3J is flipped over, and temporary substrate 3000 is removed to expose buffer layer 3100.

Figure 3L:
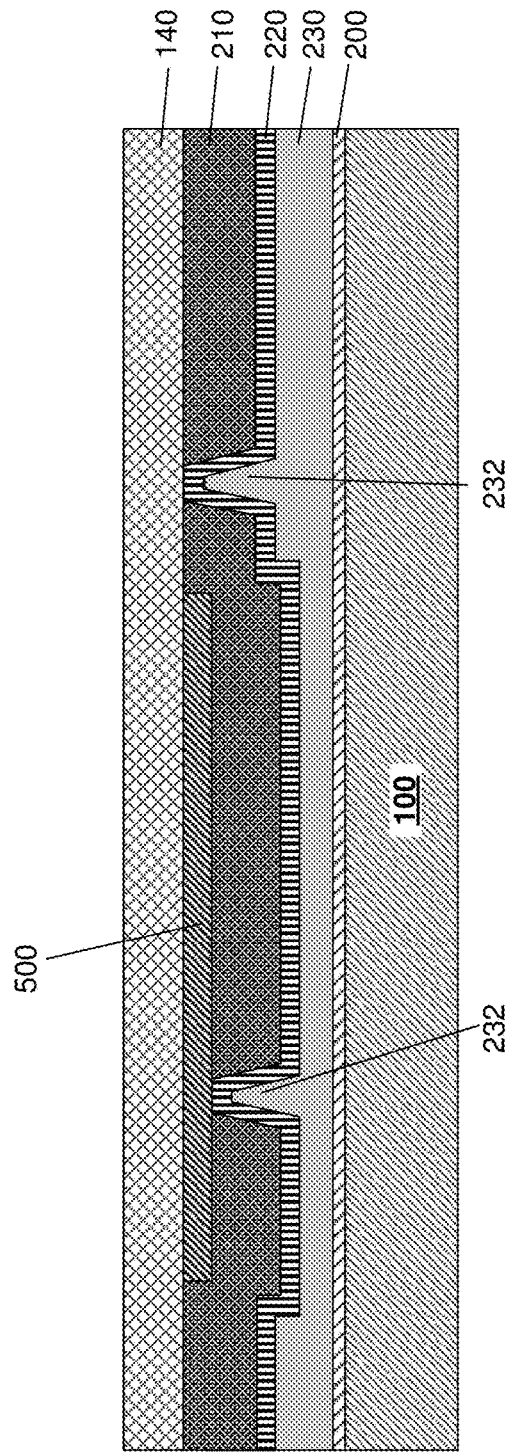

As illustrated in FIG. 3L, in step S10, buffer layer 3100 is removed to expose a surface layer of piezoelectric layer 140.

Figure 3M:
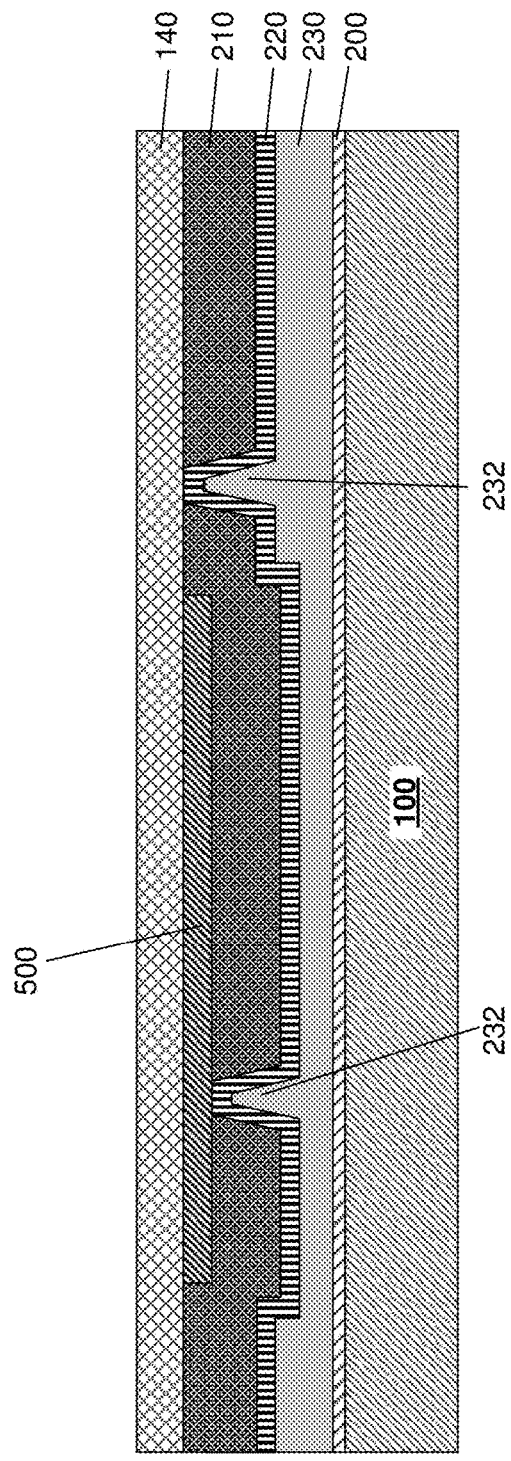

As illustrated in FIG. 3M, in step S11, a dry etching or an ion beam etching (IBE) process is performed to remove the exposed surface layer of piezoelectric layer 140. As a result, the thickness of piezoelectric layer 140 may be accurately controlled to be equal to the target thickness required for BAW resonator 10. The removed portion of piezoelectric layer 140 is the initially deposited portion of piezoelectric layer 140, the quality of which is relatively low and the piezoelectric performance of which is relatively poor. Thus, the removal of the initially deposited portion of piezoelectric layer 140 improves the performance of BAW resonator 10.

Figure 3N:
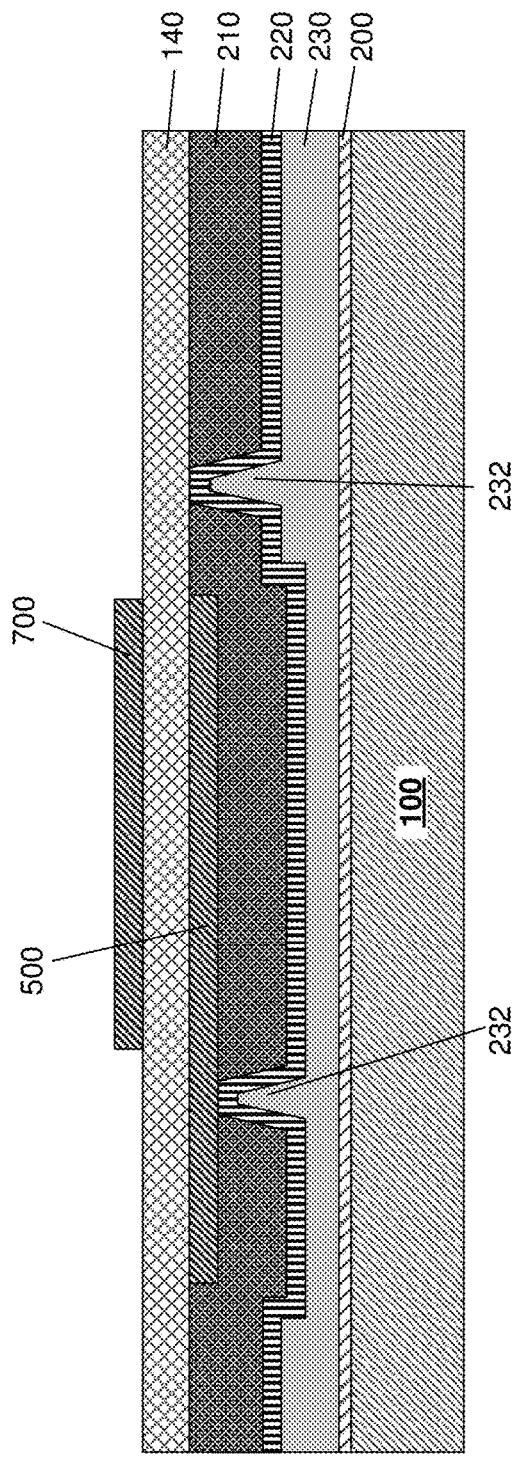

As illustrated in FIG. 3N, in step S12, second electrode 700 is formed on piezoelectric layer 140. Second electrode 700 partially overlaps with first electrode 500. The overlapping portions of first electrode 500 and second electrode 700 are surrounded by double-wall boundary structure 300. That is, the overlapping portions of first electrode 500 and second electrode 700 are disposed with cavity 1000 to be formed in a subsequent process.

Figure 3O:
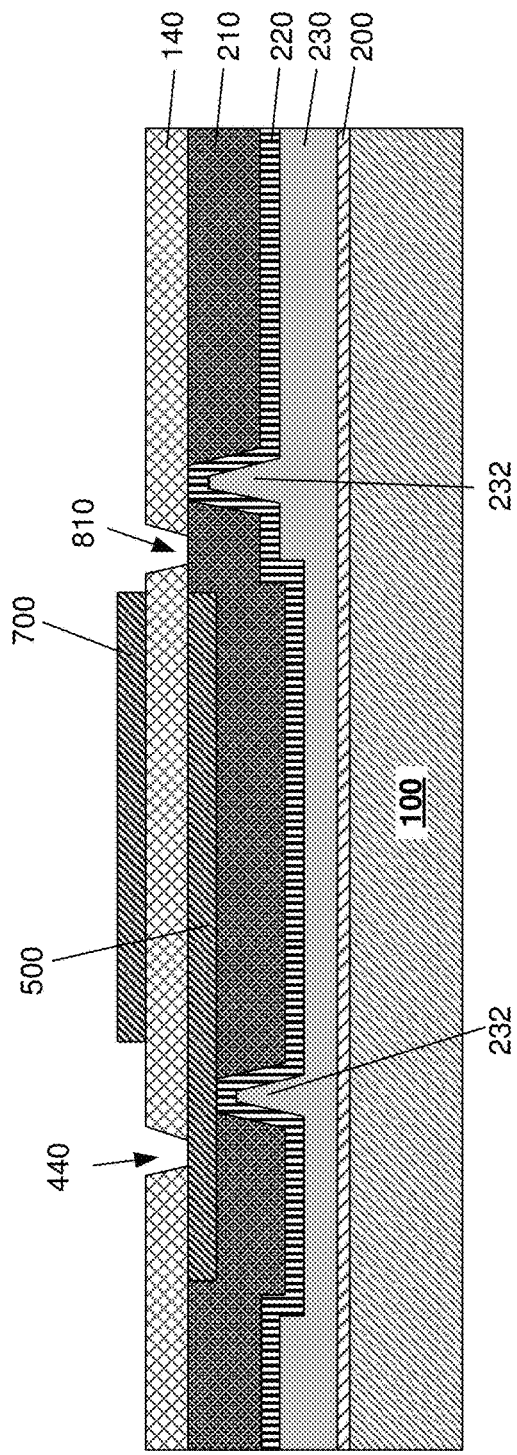

As illustrated in FIG. 3O, in step S13, piezoelectric layer 140 is etched to form contact hole 440 and one or more release holes 810. Contact hole 440 exposes a portion of first electrode 500. Release holes 810 expose portions of first dielectric layer 210.

Figure 3P:
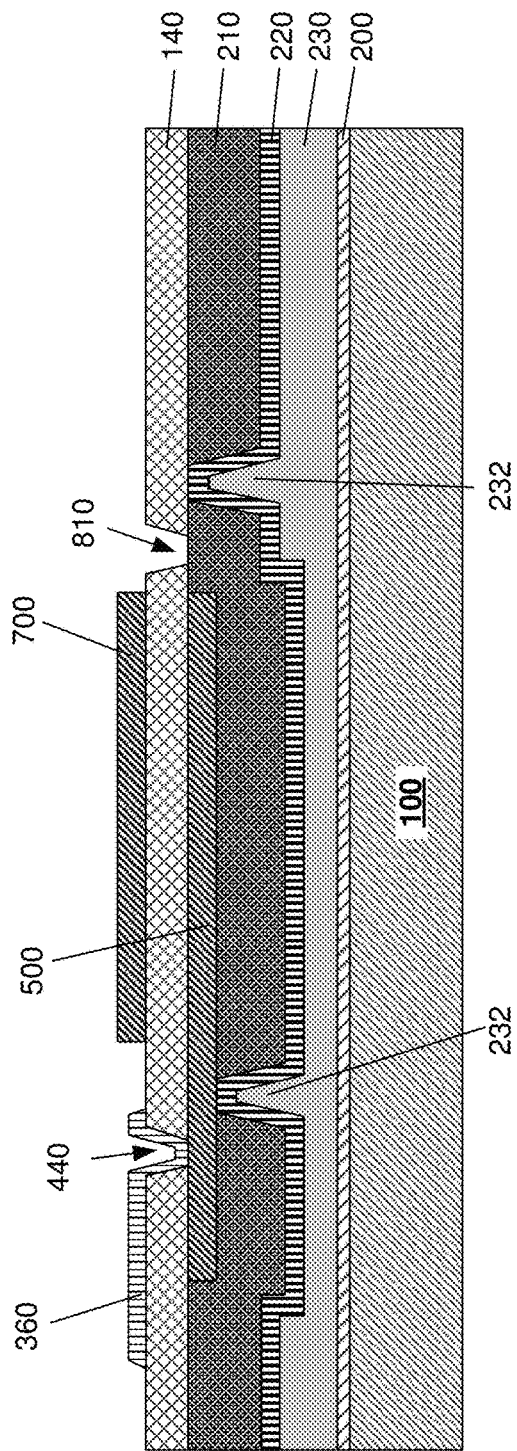
Figure 3Q:
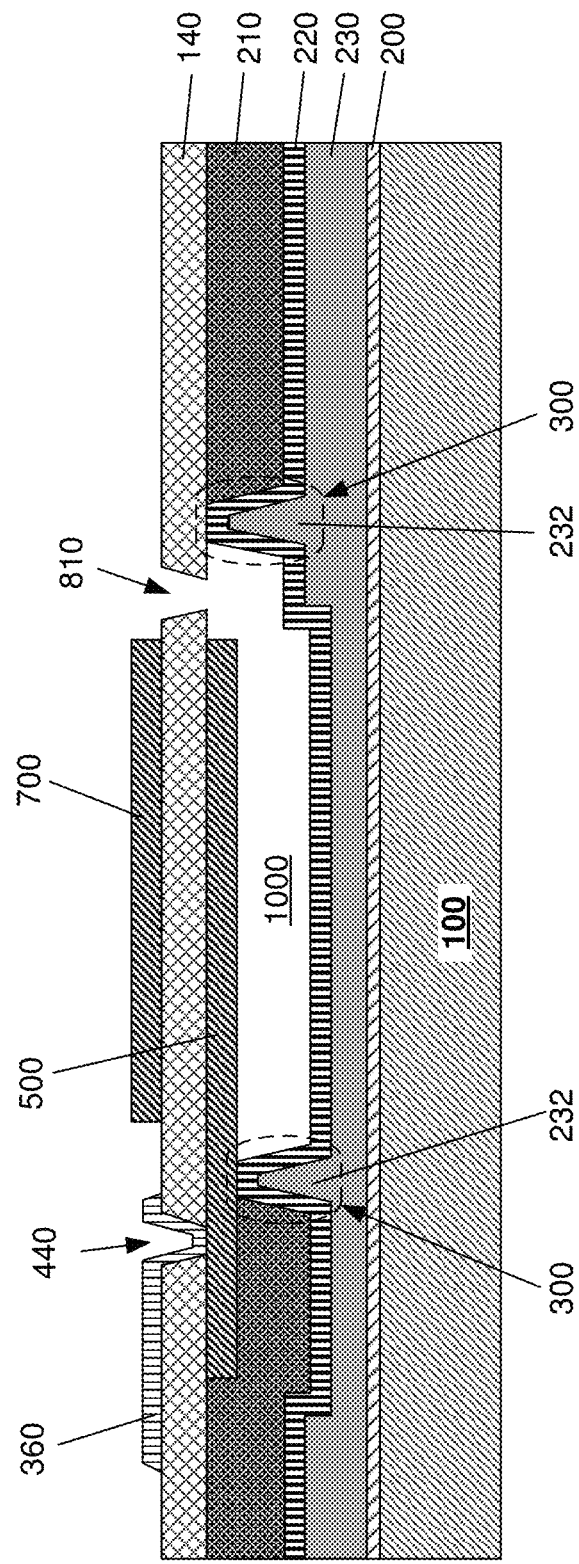

As illustrated in FIG. 3P, in step S14, pad metal layer 360 is formed on piezoelectric layer 140 and in contact hole 440. Pad metal layer 360 is electrically connected to first electrode 500 via contact hole 440. Pad metal layer 360 is used for external electrical connection of BAW resonator 10

As illustrated in FIG. 3Q, in step S15, the portion of first dielectric layer 210 surrounded by double-wall boundary structure 300 is etched and removed to form cavity 1000. The etchant and etching product formed during the etching process is released via the one or more release holes 810. Thus, BAW resonator 10 illustrated in FIGS. 1A and 1B is fabricated.

Other embodiments of the disclosure will be apparent to those skilled in the art from consideration of the specification and practice of the disclosure disclosed herein. It is intended that the specification and examples be considered as exemplary only, with a true scope and spirit of the invention being indicated by the following claims.

What is claimed is:
1. A bulk acoustic wave (BAW) resonator, comprising:
a substrate;
a piezoelectric layer disposed above the substrate;
a first electrode disposed below the piezoelectric layer;
a second electrode disposed above the piezoelectric layer;
a dielectric layer disposed between the substrate and the piezoelectric layer, the dielectric layer including a cavity; and
a bonding layer disposed between the dielectric layer and the substrate, the bonding layer being formed of amorphous silicon,
wherein the dielectric layer includes a first dielectric layer, a second dielectric layer, and a third dielectric layer.

2. The BAW resonator of claim 1, wherein the piezoelectric layer is formed of AlN or ScAlN.

3. The BAW resonator of claim 1, wherein the first dielectric layer is disposed below the piezoelectric layer and includes the cavity,
the third dielectric layer is disposed below the first dielectric layer and includes a protruding structure protruding towards the piezoelectric layer, and
the second dielectric layer overlays the third dielectric layer including the protruding structure.

4. The BAW resonator of claim 3, wherein the second dielectric layer and the protruding structure of the third dielectric layer together constitute a double-wall boundary structure surrounding the cavity.

5. The BAW resonator of claim 1, wherein the second dielectric layer contacts a portion of the piezoelectric layer and a portion of the first electrode.

6. The BAW resonator of claim 1, wherein the first dielectric layer is formed of silicon oxide.

7. The BAW resonator of claim 1, wherein the second dielectric layer is formed of polysilicon, amorphous silicon, silicon nitride, aluminum nitride, gallium nitride, tantalum nitride, or a stacked combination of two or more of those materials.

8. The BAW resonator of claim 1, wherein the third dielectric layer is formed of silicon oxide, silicon nitride, aluminum nitride, or a stacked combination of two or more of those materials.

9. The BAW resonator of claim 1, wherein the bonding layer has a thickness ranging from approximately 3 nm to approximately 50 nm.

10. The BAW resonator of claim 1, wherein the substrate is formed of silicon.

11. The BAW resonator of claim 1, wherein the substrate comprises:
a surface layer facing the bonding layer and formed of silicon; and
a body formed of silicon oxide, sapphire ($Al_2O_3$), gallium nitride, silicon carbide, aluminum nitride, silicon nitride, or a stacked combination of two or more of those materials.

12. The BAW resonator of claim 1, further comprising:
one or more release holes formed in the piezoelectric layer, and exposing the cavity.

13. The BAW resonator of claim 1, further comprising:
a contact hole in the piezoelectric layer, and exposing a portion of the first electrode; and
a pad metal layer disposed on the piezoelectric layer and in the contact hole, and electrically connected to the first electrode via the contact hole.

* * * * *